US005280528A

United States Patent [19]

Fosgate

[11] Patent Number: 5,280,528

[45] Date of Patent: Jan. 18, 1994

[54] BAND PASS FILTER CIRCUIT FOR REAR CHANNEL FILTERING IN A SURROUND PROCESSOR

[76] Inventor: James W. Fosgate, 4750 E. 1200 South, Heber City, Utah 84032

[21] Appl. No.: 983,689

[22] Filed: Dec. 1, 1992

Related U.S. Application Data

[60] Division of Ser. No. 789,529, Nov. 14, 1991, which is a continuation-in-part of Ser. No. 533,091, Jun. 8, 1990, Pat. No. 5,172,415.

[51] Int. Cl.[5] .......................... H03G 3/00; H03G 5/00; H04R 5/00

[52] U.S. Cl. .......................................... 381/63; 381/98; 381/18

[58] Field of Search ........................ 381/18, 22, 63, 64, 381/98; 330/306; 307/520

[56] References Cited

U.S. PATENT DOCUMENTS 3,632,886 1/1972 Scheiber .
3,708,631 1/1973 Bauer et al. .
3,746,792 7/1973 Scheiber .
3,836,715 9/1974 Ito et al. .
3,864,516 2/1975 Kameoka et al. .
3,883,692 5/1975 Tsurushima .
3,883,832 5/1975 Fosgate .
3,885,099 5/1975 Tsurushima .
3,943,287 3/1976 Gravereaux et al. .
3,944,735 3/1976 Willcocks .
3,959,590 5/1976 Scheiber .
4,306,200 12/1981 Takayama .......................... 330/306
4,704,728 11/1987 Scheiber .
4,706,287 11/1987 Blackmer et al. ..................... 381/63
4,891,839 1/1990 Scheiber .
4,932,059 6/1990 Fosgate .
5,046,098 9/1991 Mandell et al. .

FOREIGN PATENT DOCUMENTS 3914630 11/1989 Fed. Rep. of Germany ........ 381/98

*Primary Examiner*—Forester W. Isen
*Assistant Examiner*—P. W. Lee
*Attorney, Agent, or Firm*—David L. McCombs

[57] ABSTRACT

A method and apparatus for generating control voltage signals in a surround sound processor is disclosed which utilizes a on-shot monostable multivibrator for minimizing intermodulation distortion while following rapid directional change yet minimizing intermodulation distortion. The apparatus includes means for smoothing the directional information signals derived from audio input signals each with a continuously variable time constant to generate a corresponding control voltage signal, such that each time constant depends inversely upon the magnitude of the difference between the directional information signal applied thereto and the corresponding control voltage signal generated thereby. A one-shot means temporarily reduces the value of the continuously variable time constant associated with each of the smoothing means to a predetermined minimum value for a short, predetermined time period so that each of the corresponding control voltage signals rapidly approaches the value of its corresponding directional information signal within this time period, the one-shot being activated when the difference between any one of the directional information signals and its corresponding control voltage signal exceeds a predetermined threshold value. Other improvements are incorporated in the surround sound processor to optimize its performance.

3 Claims, 7 Drawing Sheets

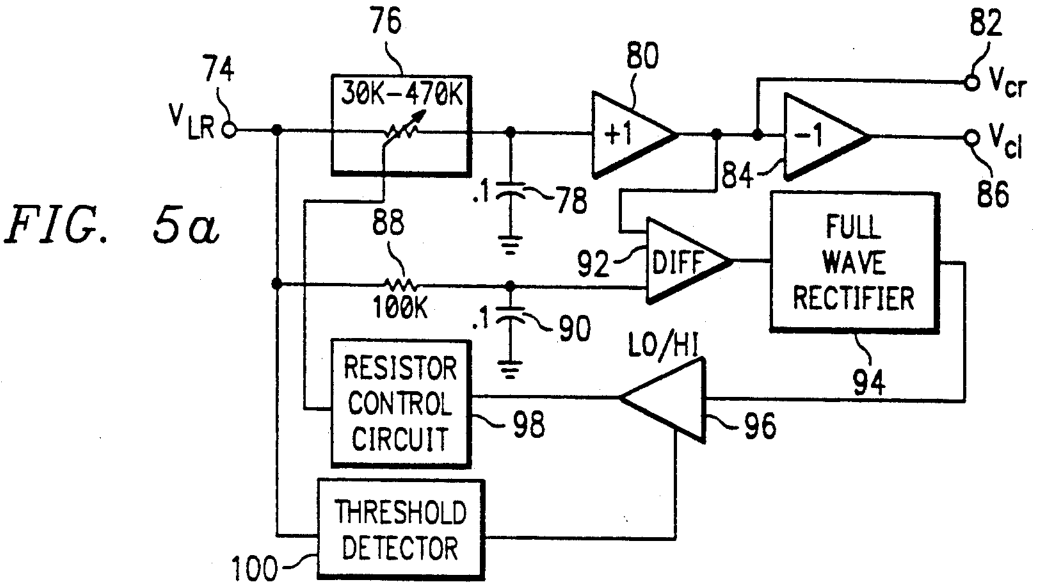
FIG. 5a
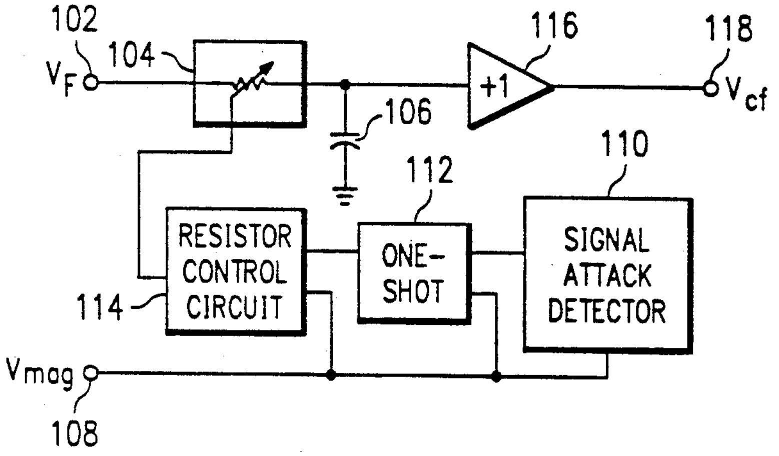
FIG. 5b
FIG. 6
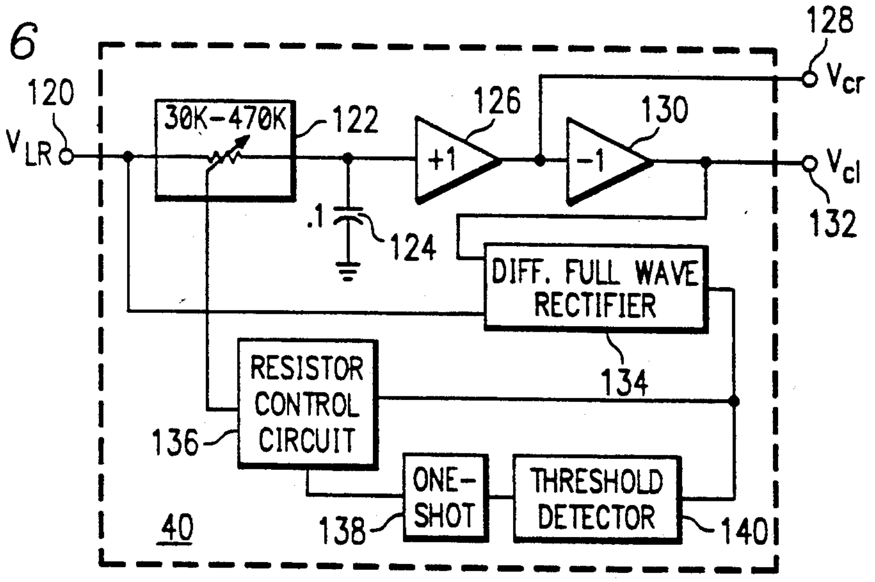

BAND PASS FILTER CIRCUIT FOR REAR CHANNEL FILTERING IN A SURROUND PROCESSOR

CROSS REFERENCE TO RELATED APPLICATION

This is a divisional of co-pending application Ser. No. 07/789,529 filed on Nov. 14, 1991, which is a continuation-in-part of copending application Ser. No. 07/533,091, filed Jun. 8, 1990 now U.S. Pat. No. 5,172,415.

TECHNICAL FIELD

The present invention relates in general to processors for the periphonic reproduction of sound. More specifically, the invention relates to improvements in the servologic control voltage generator of a surround sound processor for multichannel redistribution of audio signals.

BACKGROUND OF THE INVENTION

This invention relates to improvements in a surround sound processor. A surround sound processor operates to enhance a two-channel stereophonic source signal so as to drive a multiplicity of loudspeakers arranged to surround the listener, in a manner to provide a high-definition soundfield directly comparable to discrete multitrack sources in perceived performance. An illusion of space may thus be created enabling the listener to experience the fullness, directional quality and aural dimension or "spaciousness" of the original sound environment. The foregoing so-called periphonic reproduction of sound can be distinguished from the operation of conventional soundfield processors which rely on digitally generated time delay of audio signals to simulate reverberation or "ambience" associated with live sound events. These conventional systems do not directionally localize sounds based on information from the original performance space and the resulting reverberation characteristics are noticeably artificial.

To accomplish this end, a surround sound processor typically comprises an input matrix, a control voltage generator and a variable matrix circuit.

The input matrix usually provides for balance and level control of the input signals, generates normal and inverted polarity versions of the input signals, generates sum and difference signals, and in some cases generates phase shifted versions, and/or filters the signals into multiple frequency ranges as needed by the remainder of the processing requirements.

The control voltage generator includes a directional detector and a servologic circuit. The directional detector measures the correlations between the signals which represent sounds encoded at different directions in the stereophonic sound stage, generating voltages corresponding to the predominant sound directional location. The servologic circuit uses these signals to develop control voltages for varying the gain of voltage controlled amplifiers in the variable matrix circuit in accordance with the sound direction and the direction in which it is intended to reproduce the sound in the surrounding loudspeakers.

The variable matrix circuit includes voltage-controlled amplifiers and a separation matrix. The voltage controlled amplifiers amplify the input matrix audio signals with variable gain, for application to the separation matrix, where they are used to selectively cancel crosstalk into different loudspeaker feed signals. The separation matrix combines the outputs of the input matrix and of the voltage-controlled amplifiers in several different ways, each resulting in a loudspeaker feed signal, for a loudspeaker to be positioned in one of several different locations surrounding the listener. In each of these signals, certain signal components may be dynamically eliminated by the action of the detector, control voltage generator, voltage controlled amplifiers (VCA's) and separation matrix.

In his copending U.S. patent application No. 533,091, entitled "Surround Processor", Fosgate discloses a servologic circuit of a control voltage generator which employs a width modulated pulse train to vary the time constants applied to the control signals, in accordance with the difference between the raw detector output signals and the smoothed control signals resulting after they have been passed through the variable time-constant filters, thereby placing the modulating elements within a feedback loop, as shown in FIGS. 5–7 of the application and FIG. 5*a* herein.

In U.S. Pat. No. 4,932,059, Fosgate discloses use of variable time constants operated by means of a width-modulated pulse train, the duty cycle of which is controlled by means of a signal level detector, and further by means of a one-shot monostable multivibrator responsive to signal "attacks." This one-shot is so designed that the output pulse duration is sufficiently long to ensure that the control signals reach their appropriate values fairly quickly, but is sufficiently short that very low transient intermodulation distortion occurs, such that the listener is unable to hear any artifacts in the decoding process. This scheme is described with reference to FIGS. 2–5 and 6*a* and 6*b* of the above-referenced patent and in FIG. 5*b* herein.

In surround sound processors, much of the subtleties of the presentation are due to the characteristics of the directional detector and servologic circuit of the control voltage generator and of the VCA's. As these are further refined, the apparent performance becomes more transparent and effortless sounding to the listener.

SUMMARY OF THE INVENTION

It is an object of the invention to provide an improved surround sound processor for the reproduction of sound from a stereophonic source in a manner comparable to a live presentation from multiple sources in perceived performances.

It is another object of the present invention to provide a surround sound processor of the above type which provides faster but smoother and more realistic multichannel sound redistribution from a stereophonic source.

It is another object of the present invention to simplify and improve the circuitry used in the control voltage generator of a surround sound processor of the above type.

In accordance with these and other objects, the present invention relates in particular to improvements in the implementation of the circuitry of a servologic control voltage generator for a surround sound processor. In a departure from the art, a time constant processing circuit for generating control voltage signals used in the matrix decoding of audio input signals containing varying directional information includes the use of a one-shot monostable multivibrator for rapidly correcting the control voltage signals during fast changes in the directional information signals while minimizing transient intermodulation distortion produced thereby. Such distortion tends to occur with large and fast changes in the directional information signals corresponding with sudden "attacks" in the audio information presented to the surround sound processor.

Specifically, the control voltage generator of the present invention includes a time constant processing circuit for smoothing directional information signals produced by a detector circuit with continuously variable time constants in order to generate one or more control voltage signals. The time constant processing circuit is responsive to both the amplitude and the rate of change of the directional information signals, such that as the difference between each of the directional information signals and its corresponding control voltage signal increases, the value of the corresponding time constant decreases, so as to allow the control voltage signal to more closely follow the directional information signal. Furthermore, if the difference between any of these signals increases beyond a certain threshold value, a one-shot monostable multivibrator is triggered, and causes the time constants applied to all of the directional information signals to be reduced to the minimum value for a short, predetermined period of time, so that all the control voltage signals rapidly catch up with the directional information signals from the directional detector circuit. When the difference between the directional information signals and their corresponding control voltage signals decreases, the corresponding time constant increases so as to provide very smooth processing of the audio information.

In an illustrative embodiment, the apparatus includes means for smoothing the directional information signals derived from audio input signals each with a continuously variable time constant to generate a corresponding control voltage signal, such that the time constant depends inversely upon the magnitude of the difference between the directional information signal and the corresponding control voltage signal. A one-shot means temporarily reduces the value of the continuously variable time constant associated with each of the smoothing means to a predetermined minimum value for a short, predetermined time period so that each of the corresponding control voltage signals rapidly approaches the value of its corresponding directional information signal within the time period. The one-shot means is activated when the difference between any one of the directional information signals and its corresponding control voltage signal exceeds a predetermined threshold value.

In another aspect, the present invention provides a control voltage generator with an improved directional detector circuit for providing the directional information signals to the smoothing means. The detector circuit utilizes matched resistors and faster inverting amplifier means in order to maintain logarithmic characteristics over a large range. Generating a smooth output voltage.

In another aspect, the invention provides an improved bandpass filter arrangement for filtering the audio input signals supplied to the directional detector circuits. The arrangement weights the frequency components of the audio input signals to values corresponding to the sensitivity of the ear over the audible frequency range by providing three poles of low-frequency roll-off, a midfrequency shelf response and a single pole of high-frequency roll off.

In another aspect, the present invention provides a rear channel filter which avoids the breakthrough of sibilants or high frequency sounds "splashing" into the rear of the listening area. The filter approximates the acoustic absorption typical in a live performance and is especially useful for classical music reproduction.

In another aspect, the invention provides an improved monophonic enhancement circuit in which pseudo-stereo left and right channel signals are generated from a monophonic audio signal source. The circuit employs two phase shifter means operating over different frequency ranges where both the bass frequencies and the high frequency, potentially sibilant information are in phase, with a midrange therebetween having a phase difference of a set maximum value.

BRIEF DESCRIPTION OF THE DRAWINGS

The novel features believed characteristic of the present invention are set forth in the appended claims. The invention itself, as well as other features and advantages thereof, will best be understood by reference to the following detailed description of an illustrative embodiment when read in conjunction with the accompanying figures, wherein:

FIG. 5*a* is a block schematic of a servologic circuit according to copending application Ser. No. 07/533,091;

FIG. 5*b* is a block schematic of a variable filter circuit according to the prior art;

FIG. 6 is a block schematic of a servologic circuit according to the present invention showing improvements in circuitry and the addition of a one-shot;

DETAILED DESCRIPTION OF THE INVENTION

The disclosure of copending application Ser. No. 07/533,091 is incorporated herein by reference.

It will be appreciated that the present invention can take many forms and embodiments. Some embodiments of the invention are illustrated herein for purposes of understanding the invention. The embodiments shown herein are intended to illustrate, and not to limit the invention. In the accompanying drawings, part numbers and values of components are set forth, which components and parts are commercially available at the present time from commercial vendors.

Figure 1:
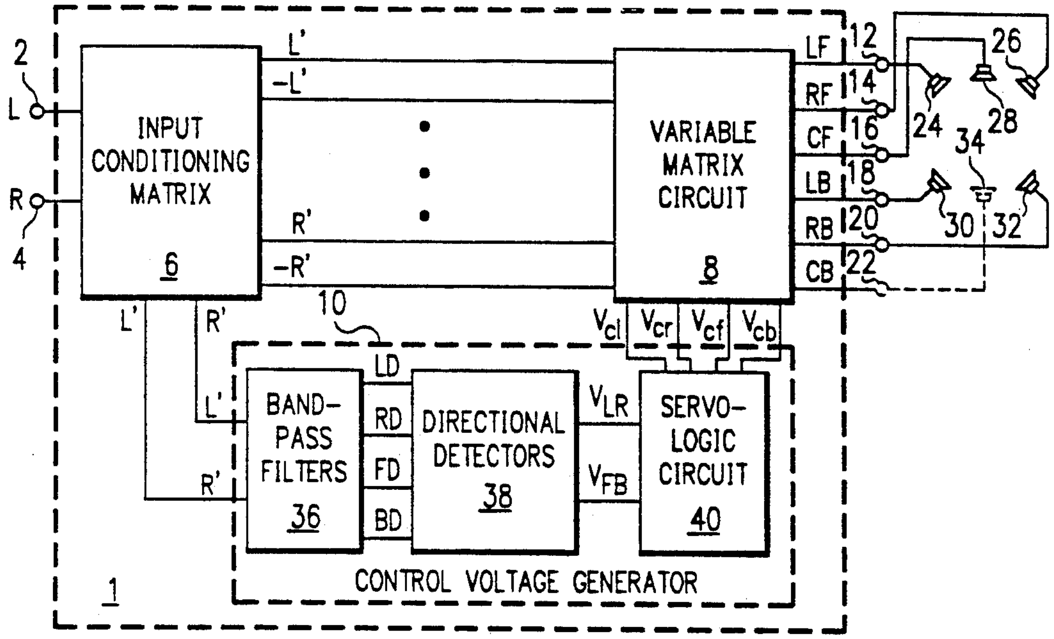
FIG. 1 is a block diagram which illustrates a surround sound processor involving the present invention.

With reference to FIG. 1, there is shown a block diagram of a surround processor 1 embodying features of the present invention having signal input terminals 2 and 4. The processor 1 includes an input conditioning matrix circuit 6, a variable matrixing circuit 8 and a control voltage generator (CVG) 10. The input terminals 2 and 4 are connected to the input conditioning matrix circuit 6 for receiving left (L) and right (R) channel signals, respectively, from a stereophonic source. It is understood that the left and right signals may or may not be encoded in a conventional manner for surround processing.

Within the matrix circuit 6, the L and R signals are combined in a variety of ways and amplified to a suitable level for optimum operation of the remaining circuitry. The signals L', R' and their inverted polarity forms −L', −R', together with other possible outputs of the matrix circuit 6 are applied to the variable matrixing circuit 8. Possible outputs of the matrix circuit 6 also include sum and difference signals L'+R', L'−R', and low-pass filtered versions of any of these signals if split-band processing is employed. It is understood that a panorama control (not shown) according to the copending application Ser. No. 07/533,091 may also be included in the conditioning matrix circuit 6.

While not shown, the variable matrixing circuit 8 includes a set of voltage controlled amplifiers (VCA's) and a separation matrix. The VCA's are controlled by control voltage signals received from the control voltage generator 10, as will be discussed below. The separation matrix includes a number of summing amplifiers (also not shown) for combining the audio input signals received through the conditioning matrix 6 in various ways whereby a plurality of speaker feed signals are produced, in which the unwanted crosstalk elements are cancelled out by means of the signals passed through the VCA's. These speaker feed signals, labeled LF, RF, CF, LB, RB, and CB, appear at terminals 12, 14, 16, 18, 20 and 22 respectively, and are applied, employing suitable power amplification, to loudspeakers placed in appropriate locations in a listening room, 24, 26, 28, 30, 32 and 34 respectively. In some variations, terminal 22 and speaker 34 may be omitted, and these are shown in broken line form to indicate this possibility.

The control voltage generator 10 also receives the signals L' and R' from the conditioning matrix 6, and generates control voltage signals labeled $V_{CF}$, $V_{CL}$, $V_{CL}$ and $V_{CR}$ in a manner to be described. These signals are applied to the variable matrixing means 8.

The control voltage generator 10 includes a band pass filter block 36, a directional detector block 38 and a servologic circuit 40. The block 36 receives the conditioned signals L' and R' from the matrix 6 and supplies these signals to improved band-pass filters and means for generating sum and difference signals from the output of the filters, as will be described below with reference to FIG. 2. These filtered signals designated by the references LD, RD and their sum FD and difference BD are applied to the directional detector block 38.

The directional detector block 38 utilizes directional detector means, subsequently described, to determine or "sense" the ratio of front to back and left to right information contained in the stereo input to the processor 1. The block 38 receives the filtered signals LD, RD, FD, BD from the block 36 and generates a signal $V_{FB}$ corresponding to the logarithm of the ratio of front to back information in the input signals and signal $V_{LR}$ corresponding to the logarithm of the ratio between left and right information in the input signals. According to the invention, features of the directional detector block 38 are described later with reference to FIG. 4.

The outputs $V_{FB}$ and $V_{LR}$ from the detector block 38 are applied to the servologic circuit 40. The purpose of the servologic circuit 40 is to "smooth" the output voltages $V_{FB}$ and $V_{LR}$ obtained from the detector block 38 and to split these respective voltages each into a pair of control voltages moving in opposite senses for driving the voltage-controlled amplifiers (VCAs), not shown, of the variable matrix circuit 8. For example, the output voltage $V_{FB}$ is split into the pair of control voltages Vcf and $V_{cb}$ which move in opposite senses for driving the front and back voltage-controlled amplifiers, respectively. Similarly, the output voltage $V_{LR}$ is split into the pair of control voltages $V_{CL}$ and $V_{CR}$ which move in opposite senses for driving the left and right VCAs of the variable matrix circuit 8, respectively. Thus, as previously, mentioned, the control voltages $V_{CF}$, $V_{cb}$, $V_{cL}$ and $V_{CR}$ operate to vary the gains of the VCAs thereby varying the separation of the audio signals received by the processor 1 dynamically so as to increase the directionality of the sound reproduced by the loudspeakers 24–32. Features of the servologic circuit 40 are described below with reference to FIGS. 6 and 7.

Figure 2:
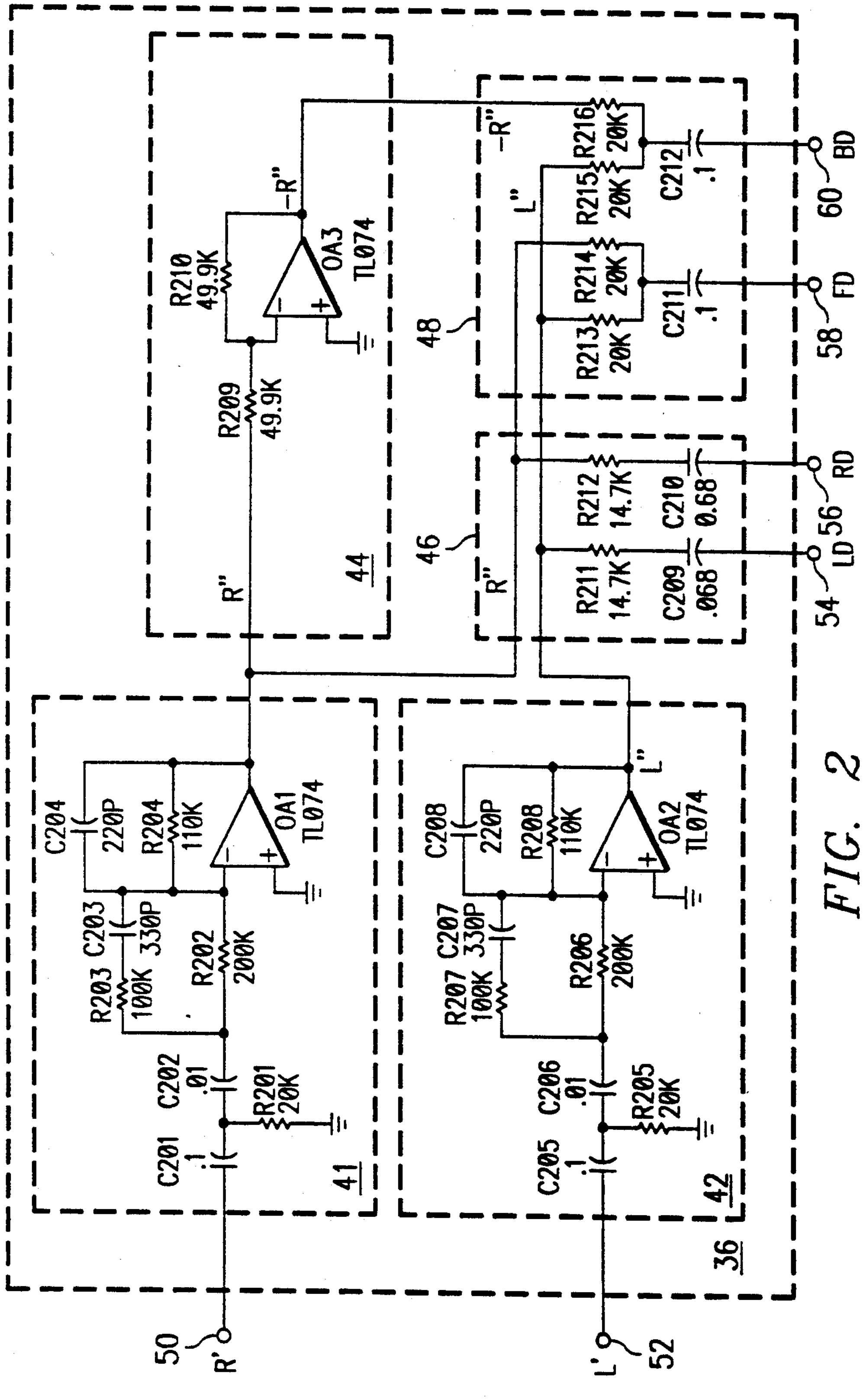
FIG. 2 is a detailed schematic of a predetector filter and signal combiner according to the present invention.

FIG. 2 illustrates the details of the band-pass filter block 36 used to shape the frequency response of the directional detector block 38. The block 36 comprises two identical band pass filter stages 41 and 42, an inverting amplifier 44 and signal combining networks 46 and 48. As discussed below, the configuration of the filter stages 41, 42 and the networks 46, 48 enable improved operating characteristics.

The R' and L' signals from input conditioning matrix 6 of FIG. 1 .are applied to terminals 50 and 52 respectively, the input terminals of two identical band-pass filter stages 41, 42. The components in the two filter stages 41, 42 are matched closely, so that the amplitude and phase characteristics are the same for both filters. The component values shown have been found to be suitable for achieving a frequency response curve which roughly mirrors the sensitivity of the human ear, this having been found advisable by many researchers in this field.

The circuit of the filter stage 41 comprises a band-pass network combining a two pole high pass bass roll-off, a midrange shelf filter and a single pole high frequency roll-off. Capacitors C201 and C202, with resistors R201 and R202 provide the low frequency roll-off. The R-C network comprising R203 and C203, in parallel with resistor R202, provides the midrange shelving. The capacitor C204 in parallel with the resistor R204 in the feedback path of the operational amplifier OAI provides the high frequency roll off. The circuit of the filter stage 42 is identical, and the components therein are matched to those in the filter stage 41, for accurate operation of the detector 38, described below.

The outputs of filter stages 41 and 42 and the inverter amplifier 44 are designated R'', L'', and −R'', respectively. The output R'' of filter stage 41 is applied to the inverting amplifier 44, which has unity gain as the values of resistors R209 and R210 are equal, to produce the output −R''. The outputs R'' and L'' from the stages 41, 42 are applied to both signal combining networks 46 and 48. The output −R" from the inverting amplifier 44 is also applied to the network 48.

In the network 46, the output L" is received by resistor R211 and capacitor C209 and provides an output signal labeled LD at terminal 54. The output R" is received by resistor R212 and capacitor C210 and provides an output signal labeled RD at terminal 56. Resistor R212 and capacitor C210 are selected to match resistor R211 and capacitor C209. The output current signals LD and RD are applied to left and right inputs of the directional detector 38, respectively. The network 46 thereby provides an additional pole of low frequency roll-off in the frequency response curve (FIG. 3), which is needed to achieve an 18 dB per-octave slope.

In signal combining network 48, resistors R213 and R214 combine L" and R" signals from filter stages 42 and 41, respectively, and with capacitor C211 form an output signal labeled FD at terminal 58. This provides a third pole in the low frequency roll off equivalent to that of resistor R211 and capacitor C209 producing the signal LD. Resistors R215 and R216 similarly combine L" and −R" signals from filter 42 and inverter 44 respectively, and with capacitor C212, which matches capacitor C211, provide an output current signal labeled BD at terminal 60. Once again these components provide a third low frequency pole in the filter response of the block 36.

To ensure that all four R C networks in the networks 46, 48 provide a low frequency roll-off pole at the same frequency, the capacitors C209–C212 are all graded into narrow tolerance ranges and corresponding selections made from each type, while the resistors are close-tolerance 1% metal film types. The combination current signals appearing at terminals 58 and 60 labeled FD and BD are applied as front and back input signals to the detector block 38.

An important aspect of the filter block 36 as just described is that the the values of resistors R211 and R212 and capacitors C209 and C210 are selected to make the sensitivity of a left-right detector 61 (FIG. 4) of the directional detector block 38 match that of a front-back detector 62 (FIG. 4) of the directional detector block, by establishing the correct ratio between these resistors and capacitors to those of the resistors R213–R216 and the capacitors C211 and C212 of the combining network 48. Prior art arrangements yielded a 3 dB higher sensitivity for the left-right detector 61 (FIG. 4).

Figure 3:
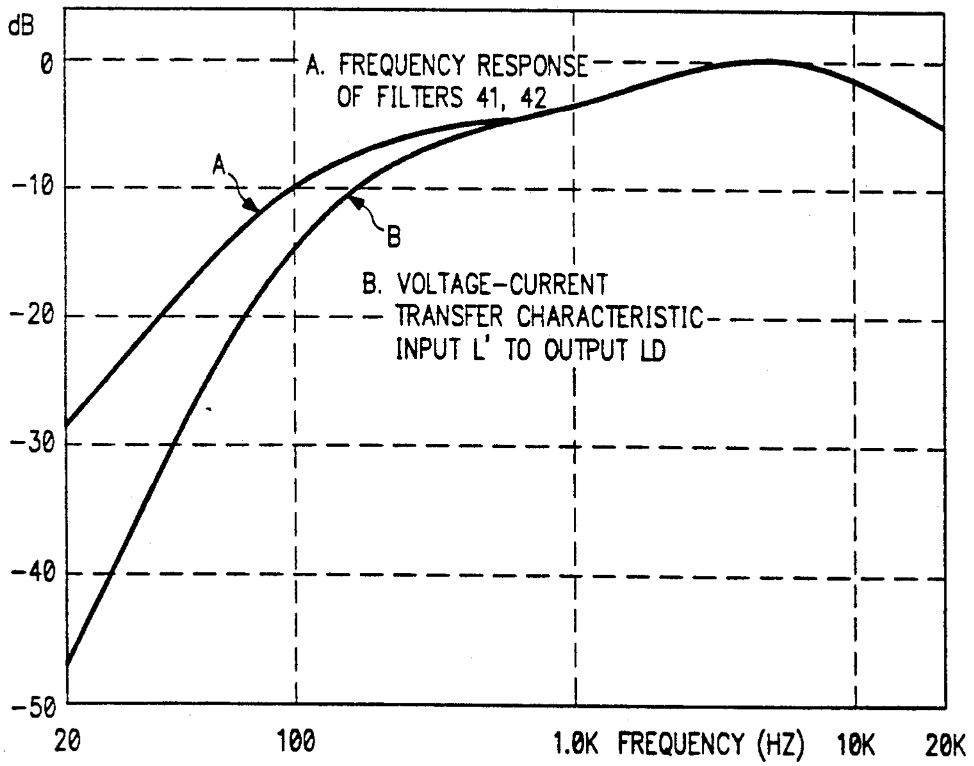
FIG. 3 is a graph showing the frequency response characteristics of the predetector filter according to FIG. 2.

FIG. 3 shows frequency response curves labeled A and B in which frequency in hertz is plotted on the horizontal scale and amplitude response in decibels is plotted on the vertical scale. The curve A represents the transfer characteristics of the filter stages 41, 42, and the curve B represents the overall transfer characteristics of these stages combined with the extra pole of low frequency roll-off provided by the networks 46, 48.

Figure 4:
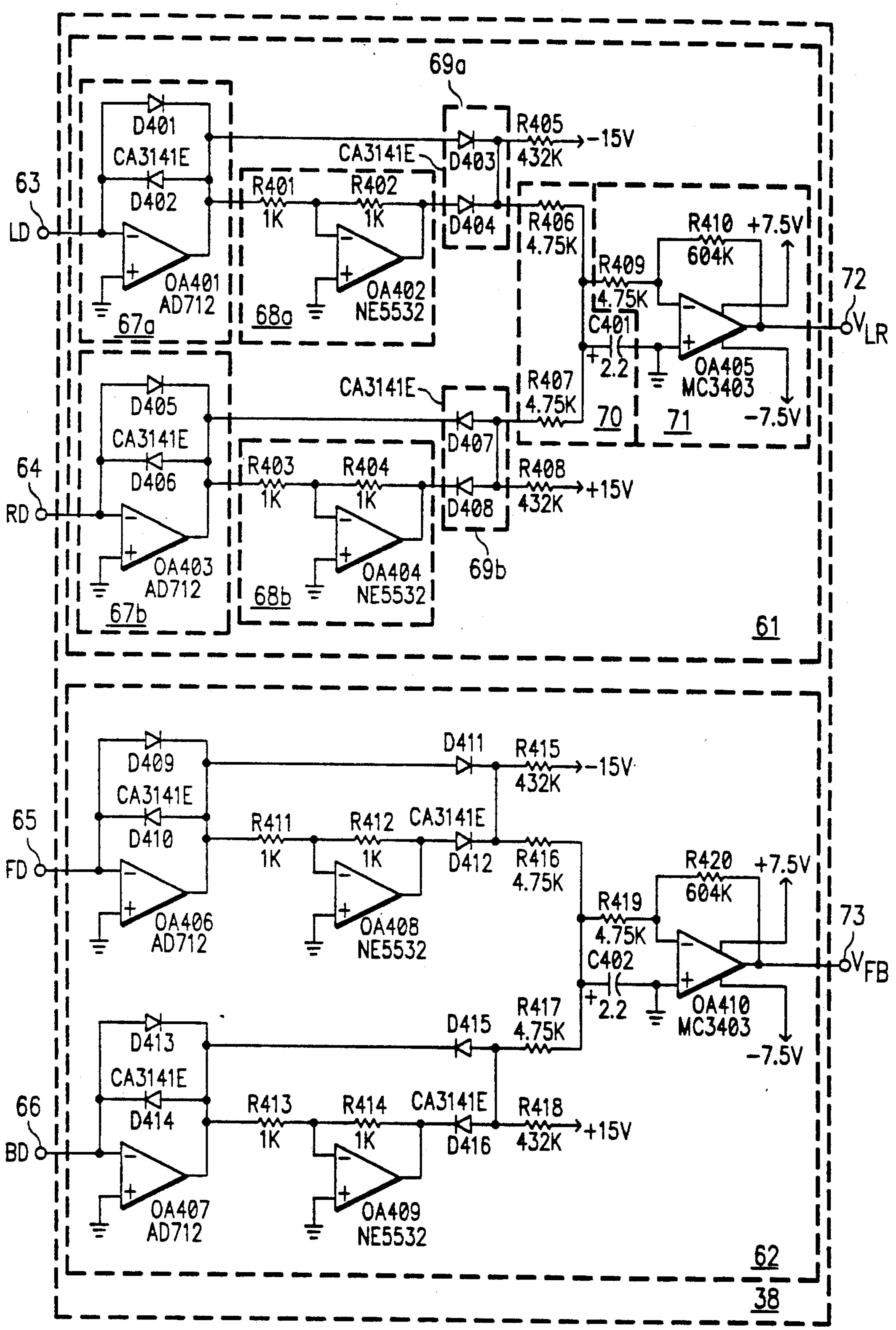
FIG. 4 is a detailed schematic diagram of a pair of log ratio detectors suitable for use within a servologic control voltage generator according to the present invention.

FIG. 4 illustrates the details of the directional detector block 38 which includes improved log ratio detectors 61 and 62 suitable for the task of determining the predominant source direction of the information contained in the stereophonic pair of input signals L' and R' which are derived from the signals L and R applied to terminals 2 and 4 of FIG. 1.

The directional detector block 38 utilizes the detectors 61 and 62 to determine or "sense" the ratio of left to right and front to back information contained in the stereo signals L' and R', which are derived from the stereo input signals L and R applied to the processor 1.

The signals LD and RD from terminals 54 and 56 of FIG. 2 are applied respectively to input terminals 63 and 64 of the upper log-ratio detector circuit 61, while signals FD and BD from terminals 58 and 60 are applied respectively to terminals 65 and 66 of the lower log ratio detector circuit 62.

The log ratio detector 61 employs logarithmic amplifiers 67*a*, 67*b*, inverters 68*a*, 68*b*, and matched biased rectifiers 69*a*, 69*b* for each of the respective inputs 63, 64. According to an aspect of the present invention, the detector 61 further combines the mean voltage outputs of these rectifiers 69*a*, 69*b* via resistors R406 and R407 into a single capacitor C401 in the block labeled 70, instead of using two separate capacitors and peak rectifiers.

In the detector 61, the LD current input applied to terminal 63 passes into a virtual ground input of operational amplifier OA401, which is a high-performance JFET input type having negligible input bias current, such as Analog Devices type AD712. This has been found to extend the dynamic range of the logging function to about 90 dB, as the input bias current of the op-amp, which is much lower for JFET types than for bipolar types such as the RC4558 type, has to be supplied by partial rectification at the input by unbalancing the currents through feedback diodes D401, D402.

Amplifier OA401 has negative feedback provided by two matched diodes D401, D402 forming part of a CA3141E integrated circuit diode array. These perform a logging function, due to the exponential voltage-current relationship of semiconductor diodes. The output of this amplifier is made to the inverter OA402, resistors R401 and R402 being matched to 0.1% to guarantee precisely unity gain. The op amp is a high speed, low noise NE5532 type. This yields improved accuracy over known arrangements which typically used RC4558 op-amps.

The two outputs from amplifiers OA401 and OA402 are full wave rectified through matched diodes D403 and D404 of the rectifier 69*a* into resistor R406. Resistor R405 connected to the negative supply rail is provided to bias the diodes slightly so that the output waveform's negative peaks will be followed. The exact value of resistor R405 is subject to an optimization procedure which determines at what low level the rectifier should be allowed to roll off its logarithmic performance, and currently a value of 432K is suggested, with the other values as shown in FIG. 4.

An exactly similar circuit is provided by means of operational amplifiers OA403 and OA404 for the RD signal applied to terminal 64 from the terminal 56 of the block 36 of FIG. 2, except that the diodes D407 and D408 of the rectifier 69*b* are in opposite polarity to corresponding diodes D403 and D404 in the uppermost rectifier 69*a*. To bias this rectifier 69*b*, resistor R408 is taken to the positive supply rail, and has the same value as resistor R405, discussed above.

The signals out of these two rectifiers 69*a*, 69*b*, one positive-going and one negative-going, are applied via resistors R406 and R407 to a common smoothing capacitor C401 in block 70, and thence to the input resistor R409 of an inverting amplifier-limiter stage 71, employing op-amp OA405, which has feedback supplied via resistor R410. The effective time constant here is that of resistors R406, R407 and R409 in parallel, with capacitor C401, and is about 3.88 ms. It will in practice be slightly longer for large changes, as one rectifier 69*a*, 69*b* will be operating with its diodes cut off, leading to a value of about 5.23 ms for this time constant.

The net signal into the amplifier OA405, therefore, is proportional to the difference between the logarithms of the amplitudes of the LD and RD current inputs, and therefore to the log ratio of these currents, as $$c \log (LD) - c \log (RD) = c \log (LD/RD) \quad (1)$$

The value of c is determined by the diode performance, which is governed by the diode equation:

$$I = I_s[\exp(qV/nkT) - 1] \quad (2)$$

where $I_s$ is the saturation current, q is the electronic charge, V is the applied voltage, k is Boltzmann's constant, T is the absolute temperature of the diode junction, and the parameter n is a factor determining departure from ideal performance due to various effects, notably doping gradients in the junction. Since $I_s$ is normally very small, the voltage across the diode for a given current in a practical range can be calculated ignoring the last term in equation 2. i.e.

$$V = (nkT/q) \ln (I/I_s) \quad (3)$$

Hence, for a 10:1 increase in current I, the voltage increases by an amount $$\begin{aligned} \delta V &= (nkT/q) \ln (10) \\ &= .0592\, n \text{ volts} \end{aligned} \quad (4)$$

This is the value of C in equation (1) above.

If the ratio of left to right current increases from 1:1 to 10:1, therefore, for the same overall input power level, the left rectifier input changes +3 dB and the right by −17 dB, so the output voltage amplitudes change respectively by +8.88 mV and −50.32 mV, prior to the rectifier diodes, assuming that n=1. These are biased to about 27 μA by the resistors R405 and R408, but also provide current via resistors R406 and R407 which may be significantly higher than this at high signal levels.

If the average current through these diodes is fairly high, then the output voltage would change by the average of +8.88 mV and +50.32 mV, which is +29.6 mV, but as resistor R409 connects to a virtual ground also, this will be reduced by a factor of 0.67, yielding a net voltage change of 19.73 mV, and an input current of 4.15 μA. Since one rectifier 69*a*, 69*b* has to provide this input current in excess of the other, each current changes by 2.08 μA and relative to 27 μA this would result in a 1.9 mV change in the drop across each rectifier, in opposition to the change due to the input current ratio change, so that the 29.6 mV is reduced to about 27.7 mV and the net input change is therefore more like 18.47 mV, with an input current of 3.89 μA.

This current passes through the feedback resistor R410, resulting in an output voltage change of 2.35 V. For each 20 dB of ratio change, therefore, the output voltage $V_{LR}$ at terminal 72 of FIG. 4 would change by this amount, but as this amplifier is supplied from +7.5 V supplies, its output is limited to about +6 V. This means that at ratios of about 50 dB or higher, the amplifier OA405 limits.

The gain of this amplifier OA405 has been optimized to provide maximum separation for signals panned between left and center, or between right and center. For example, when signals of about 1 dB difference are applied to terminals 63 and 64, about 24.8 dB difference is then applied to terminals 65 and 66, due to summing and differencing. Under these circumstances the front-back detector 62 should have an output $V_{FB}$ at terminal 73 of about 2.92 V and the left-right detector 61 output at terminal 72 should be about +118 mV. Naturally, these voltages are dependent on the overall signal level, and also on the value of n and the temperature of the diodes D401, D402, D405, D406, which are typically in the same integrated circuit (IC) package.

The front-back detector 62 of FIG. 4 is identical to the detector 61, but this is driven by the FD and BD signals from terminals 58 and 60 of FIG. 2, being connected into terminals 65 and 66 respectively. The outputs of the two detectors 61, 62 vary in a complementary manner with sine-cosine panning of the signal amplitudes in the LD and RD inputs.

FIGS. 5*a* and 5*b* illustrate other methods of generating control voltages from the output signals of detectors such as 61, 62 of the block 36 herein, so as to distinguish the novel features of the servologic circuit 40 of the present invention, described later with reference to FIGS. 6 and 7 herein.

FIG. 5*a* illustrates the servologic circuit of copending application Ser. No. 07,553,091. In FIG. 5*a*, the servologic circuit 40 receives an input signal $V_{LR}$ at terminal 74. The signal $V_{LR}$ is applied via a controlled variable resistor element 76 to a capacitor 78. This forms a variable time constant smoothing circuit, or alternatively a variable low pass filter. The voltage on capacitor 78 is buffered by unity gain buffer 80 and appears at output terminal 82 as one of a pair of control voltages, designated by $V_{cr}$, which goes positive when the right signal RD into the detector exceeds the left signal LD in magnitude. This control voltage signal at terminal 82 is also inverted by unity gain inverter 84 and appears at terminal 86 as the second control signal, $V_{cl}$.

In this scheme of the copending application referenced above, the voltage on the capacitor 78 is compared to that on capacitor 90, which is also charged from the input terminal 74 via fixed resistor 88, providing a fixed time constant. The difference between these voltages represents the effect of the slower smoothing of the variable time constant on the input signal changes. This difference signal is amplified by amplifier 92 and applied to a full wave rectifier or absolute value circuit 94.

The output of this circuit 94 is amplified by amplifier 96, which has a switchable gain. This drives a resistance control circuit 98, whose output signal is applied to variable resistor element 76 to vary the time constant. A threshold detector circuit 100 is sensitive to the magnitude of the detector output applied to input terminal 74, and when this exceeds a preset value, it applies a signal to switched amplifier 96 to increase its gain. This has the effect of reducing the variable resistor element 76 to its minimum value for a period of time which depends on the magnitude of the input signal and the difference between the input voltage and the smoothed voltage on capacitor 78, as well as the time constants in this circuit.

The resistance control circuit 98 is typically a width-modulated pulse generator, whose output pulses occur at high frequency and with a duty cycle linearly dependent on the difference voltage applied to its input. The duty cycle may range from 0 to 1. These pulses are applied to a switch element inside variable resistor element 76 to control its resistance. Resistor element 76 comprises two fixed resistors and a switch, such that when the switch is on, there is a relatively low minimum resistance across element 76, and when the switch is off, there is a high resistance across element 76. The continuous variation of the duty cycle of the high frequency pulse train applied to operate the switch therefore yields a continuously variable resistance between the minimum and maximum values defined by the fixed resistors.

FIG. 5*b* illustrates a prior art variable smoothing circuit as described by Fosgate in his U.S. Pat. No. 4,932,059. The front signal $V_F$ is applied to terminal 102 and goes via a variable resistance element 104 to a fixed capacitor 106. A voltage $V_{mag}$ representing the total signal level, which could be for example the sum of the log magnitudes of the FD and BD signals, is applied to terminal 108 and thence to a signal attack detector 110 which responds to rapid changes in this signal level. These two signals from terminal 108 and the output of attack detector 110 are applied to a one-shot circuit 112, whose output is applied along with the signal from terminal 108 to a resistance control circuit 114 which causes the resistance of variable resistor element 104 to change to a lower value as the input level increases, or when the one-shot 112 operates.

The voltage appearing on capacitor 106 may be buffered by unity gain buffer 116 and appears as $V_{cf}$ at terminal 118.

An advantage of this circuit in FIG. 5*b* is that the action of the one shot 112 occurs in a certain short time period, long enough to ensure that all the control voltages settle to their new values, but short enough to minimize any apparent transient intermodulation distortion below an audible level.

Referring to FIG. 6, there is illustrated in block schematic form the servologic circuit 40 of the present invention.

In FIG. 6, an output from a detector, such as $V_{LR}$ from terminal 72 of FIG. 4, is applied to input terminal 120. This voltage is applied via variable resistor element 122 to fixed capacitor element 124. The voltage on capacitor 124 is buffered by buffer 126 and appears at terminal 128 as the control voltage $V_{cr}$. This voltage is then inverted by inverter 130 and appears at terminal 132 as control voltage $V_{cl}$.

The difference voltage between the input at terminal 120 and that at terminal 128 is the same as the sum of the voltages at terminals 120 and 132. Therefore, both these latter voltages are applied with equal gain into a full wave rectifier circuit 134. The gain of this circuit is set to a suitable value to drive a pulse width modulated oscillator 136 which forms a resistance control circuit for varying resistor element 122. This simplification eliminates the need for a summing amplifier 92 and the switchable gain amplifier 96 as shown in FIG. 5*a*. It is also found that the fixed time constant formed by resistor 88 and capacitor 90 of FIG. 5*a* can be eliminated.

A one-shot circuit 138 is connected so as to operate on the variable resistance control element 136 and force its output to the maximum value whenever the one-shot 138 is operative. One-shot 138 is triggered by a threshold detector circuit 140, which responds to the output of the absolute value circuit 134 whenever this reaches or exceeds a preset level, and causes the time constant to be forced to its minimum value whenever it is active.

Figure 7:
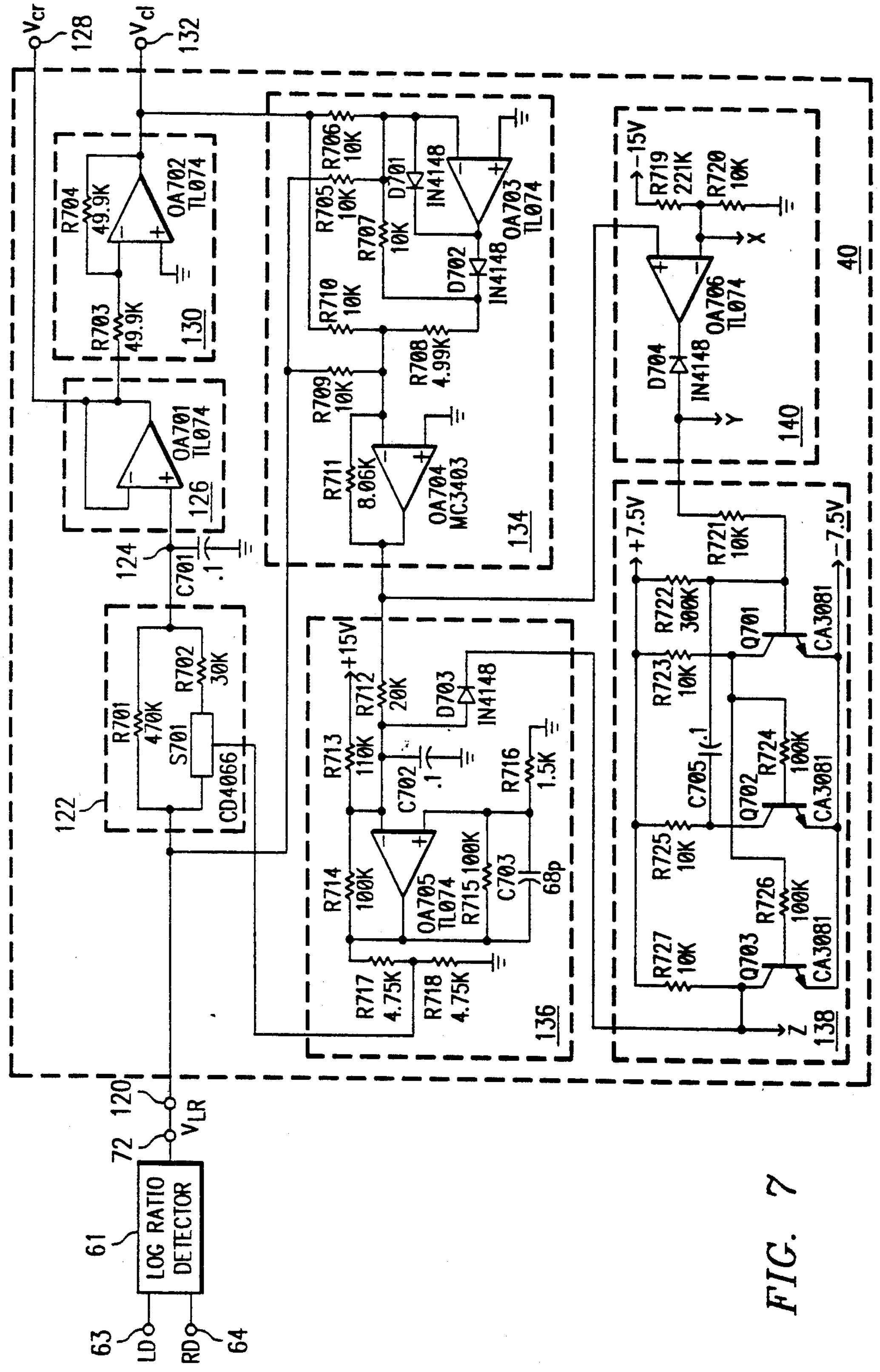
FIG. 7 is a detailed schematic of the servologic circuit of FIG. 6.

FIG. 7 shows a detailed schematic of the servologic circuit 40 according to the present invention. In FIG. 7, one half of the servologic circuit is shown which is used to generate the $V_{cl}$ and $V_{cr}$ control voltage signals, a second identical circuit being used for generating the $V_{cf}$ and $V_{cL}$ control voltage signals. The components in block 138, and the bias chain forming part of the threshold detector in block 140, are common to both circuits, however.

In FIG. 7, the log ratio detector 61, previously described in FIG. 4, receives signals LD and RD and produces a signal $V_{LR}$ at the output terminal 72. This terminal connects to the input terminal 120 of the servologic circuit 40, which is essentially organized according to the scheme of FIG. 6.

Variable resistor element 122 comprises two fixed resistors, R701 and R702, of 470K and 30K respectively, and switch S701, which may be one of four contained in industry standard part CD4066. This passes the signal at terminal 120 into capacitor 124 also labeled C701, which typically 0.1 μF. with the resistor values shown, thereby yielding a time constant that varies from 3 ms to 47 ms.

The voltage on capacitor 124 is buffered by operational amplifier OA701, connected as a voltage follower, which comprises non inverting unity gain buffer 126. The output of this buffer is connected to terminal 128 as control voltage $V_{cr}$, and is also inverted by unity gain inverter 130. This comprises two equal resistors R703, R704, connected as input and feedback resistors of an operational amplifier OA702 in inverting amplifier configuration. Amplifiers OA701 and OA702 may typically be industry type TL074, havinq JFET inputs to minimize input current. The output of inverter 130 is connected to terminal 132 as the second control voltage $V_{cl}$.

Summing rectifier circuit 134 receives two inputs: from terminal 120, via resistor R705 to the virtual ground at the inverting input of operational amplifier OA703; and from terminal 132, via resistor R706 to the same point, resistors R705 and R706 being equal. This accomplishes a subtraction since the voltage at terminal 132 is precisely the negative of that across capacitor 124. Therefore, the net input current into operational amplifier OA703 is equal to the voltageacross variable resistor element 122 divided by the 10K resistance of resistors R705 and R706.

When this current is positive (i.e. flowing into the input of op amp OA703), diode D701 conducts the same current to complete the feedback loop. Diode D702 is cut off, and as resistor R708 is connected to the virtual ground input of operational amplifier OA704, there is zero voltage across it or across resistor R707. An exactly equal current flows via the equal resistors R709 and R710 into the input of op-amp OA704, which has a feedback resistor R711 setting its gain to an appropriate value. The output voltage of op-amp OA704 therefore goes negative, and as the gain is 0.806, the output voltage is $-0.806(V_{LR}-V_{cr})$.

When this current is negative, diode D702 conducts and diode D701 is cut off. The feedback resistor R711 is now in circuit, and the voltage at the junction of resistor R711 and diode D702 goes positive to a value equaling the difference voltage across resistor R701. This voltage is applied to the inverting input of op-amp OA704 via resistor R708 of value half that of resistors R709 or R710, in this case 4.99 K, yielding a current twice that passing through R709 and R710 and in opposition to that current, so that the net input current is again positive and of the same magnitude as before. The output of op-amp OA704 therefore goes negative with a gain of 0.806 for either polarity of the difference voltage.

The output voltage of amplifier OA704 is furthermore limited because this op amp is supplied by ±7.5 V rails as shown in FIG. 4, being part of the same quad op-amp IC. This type has been chosen because of its nearly symmetrical limiting characteristics. In practice, the negative supply to it is passed through an additional diode, not shown, to achieve this symmetrical limiting, thus making the negative supply to op-amp OA704 about −6.8 V.

This output voltage is applied to the resistor control circuit 136, which is a width modulated pulse oscillator. With zero input voltage, the output of op-amp OA705 is at about −14 V, close to the negative supply rail, and the non inverting input is set to −0.2 V by the resistors R715 and R716. The voltage at the inverting input is also slightly negative, set by the bias resistor R713 and resistor R714, working into resistor R712. As the voltage applied to resistor R712 goes more negative, the voltage at the inverting input of amplifier OA705 falls until it reaches −0.2 V, when the output rapidly switches to near the positive supply voltage, as there is positive feedback via resistors R715 and R716, augmented by speedup capacitor C703. Capacitor C702 now begins to charge, via resistors R714 and R713, until its voltage reaches +0.2 V, whereupon the output voltage again switches rapidly to its original value near the negative rail. Thus an output pulse is delivered, typically about 1.6 μs long with the values shown. At this point, the oscillator frequency typically reaches about 20 kHz, yielding a duty ratio of about 0.08. It will be noted that the op-amp OA705 is being used as a comparator, and indeed a comparator such as industry type LM311 may be substituted therefor with improved speed characteristics.

As the negative voltage input to resistor R712 increases, the frequency of oscillation of the pulse generator increases and so does the on time, until the duty ratio reaches 50%, and beyond this the frequency starts to fall again, but the duty ratio continues to increase, eventually reaching 100% when the current through the resistors R713 and R714 is insufficient to overcome the +0.2 V on the non inverting input. It is fairly easy to see that the duty ratio is a linear function of the input voltage over this range, but limits at a value of 1. Since about 280 μA is flowing in the bias resistors, the voltage across resistor R712 must be about 5.6 V, and therefore the circuit limits at an input of −5.4 V or so into resistor R712.

The output of op amp OA705 is halved by equal resistors R717 and R718, so that it is suitable for application to the control input of switch S701, which is also supplied from +7.5 V supply rails. When it is positive, switch S701 is on, having a resistance of about 80 ohms, and therefore, the conductance of the circuit branch including this switch and resistor R702 is 1/30,080 =33.2 μS, while that of the fixed resistor R701 is 2.13 μS, thus yielding an effective resistance of 28.3K. When the duty ratio d is less than 1, the total conductance is (2.13+33.2 d) μS, yielding an intermediate value of resistance between 28.3K and 470K. Thus the resistance of element 122 is varied according to the voltage across it in a suitable manner.

The output of op amp OA704 also goes to a comparator circuit 140 employing op-amp OA706. A threshold voltage of −0.65 V is set by resistors R719, R720, and when the negative voltage on the output of op-amp OA704 goes more negative than this, the output of op-amp OA706 switches to near the negative rail from its quiescent state near the positive rail. This causes diode D704 to conduct, pulling the voltage on resistor R721 of one-shot 138 negative.

When this happens, transistor Q701 is switched off, causing transistor Q702 to receive base current through resistors R723 and R724. Timing capacitor C705 forces the base of transistor Q701 negative, providing positive feedback to ensure rapid switching. Because transistor Q701 is bipolar, the negative excursion may be limited by zener breakdown in this transistor. The one shot 138 releases after op-amp OA706 returns to its quiescent condition and capacitor C705 has recharged via resistor R722 to a point where transistor Q701 can turn on. This turns off transistor Q702, whose collector voltage rises with a time constant of 10 ms to the original value.

When the one-shot 138 fires, transistor Q703 is also turned on, and the voltage at its collector goes to the −7.5 V rail. This voltage is transmitted via diode D703 to the input of oscillator 136, thereby forcing its output to positive limiting as long as the pulse continues and regardless of the difference voltage input. This reduces the time constant to its minimum value of 2.83 μs. With the values given, the pulse width will be about 20 ms after op-amp OA706 returns to normal and diode D704 is cut off. During this time, the difference voltage rapidly decreases, and so does the output voltage of op-amp OA704, thereby ensuring that the control voltage $V_{cr}$ reaches a level very close to $V_{LR}$.

In the second part of the servologic circuit 40 like that of FIG. 7, for the front-back axis of the detector 38, the log ratio detector 62 has inputs FD and BD, and processes the output signal $V_{FB}$ in exactly the same way. Resistors R719 and R720 are shared with this circuit, which has a second comparator corresponding to op-amp OA706, whose inverting input is also connected to point X. This comparator also has a diode connected as for diode D704, with the cathode connected to point Y. The one-shot 138 may thus be triggered on by either the left-right or the front-back servologic circuit. Point Z is connected to the diode corresponding with diode D703 in the other circuit, so that both TWM oscillators are forced to duty ratio of 1 when the one-shot 138 is fired. This ensures that all control voltages rapidly reach the appropriate values whenever either one has changed too fast for the one-shot to remain untriggered.

It should be noted that, as the voltage across resistor element 122 increases, it represents an increasing rate of change of voltage on the capacitor 124. Thus, the output of op-amp OA704 is some function of this rate of change, and is therefore affected both by sudden changes in overall signal level, or "attacks", and by sudden changes in direction of the predominant sound (also usually caused by attacks when a new instrument or voice begins to be heard).

Thus the servologic circuit of FIG. 7 also incorporates the one-shot 138 and its triggering mechanism, with all the advantages provided by this arrangement. The exact timing may be varied by changing capacitor C705, if desired, and the threshold voltage may be altered by changing resistor R719.

Figure 8:
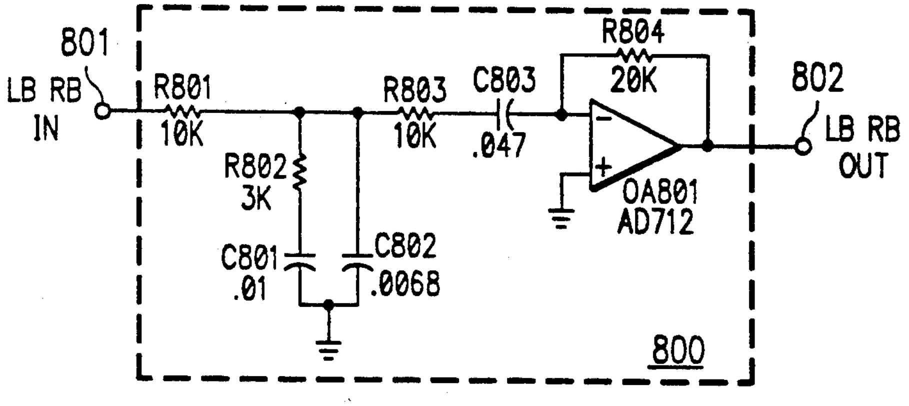
FIG. 8 is a schematic of a rear channel filter circuit in the variable matrix circuit of the processor of FIG. 1.

FIG. 8 illustrates a filter circuit 800 which comprises a part of the variable matrix circuit 8. In some modes of operation of a surround sound processor, such as when reproducing unencoded classical music, a filter may be desirable in the rear channels to render the acoustic impression of some sound absorption and to reduce the possibility of sibilant "splash" in the rear of the listening room.

In FIG. 8, resistor R801 with the network comprising resistor R802 and capacitors C801 and C802, form a "pinking" filter with a slope of approximately 3 dB/octave above about 2 kHz. Resistor R803 and capacitor C803 provide a low frequency roll-off below 200 Hz. The feedback resistor R804 around op-amp OA801 defines the gain to be about −1.5 dB at 500 Hz. Typically, this filter circuit is applied in series with both rear channel signals LB, RB, after the separation matrix 8 itself, but possibly before the volume control and other similar functions such as generating the side channels' loudspeaker feed signals.

Figure 9:
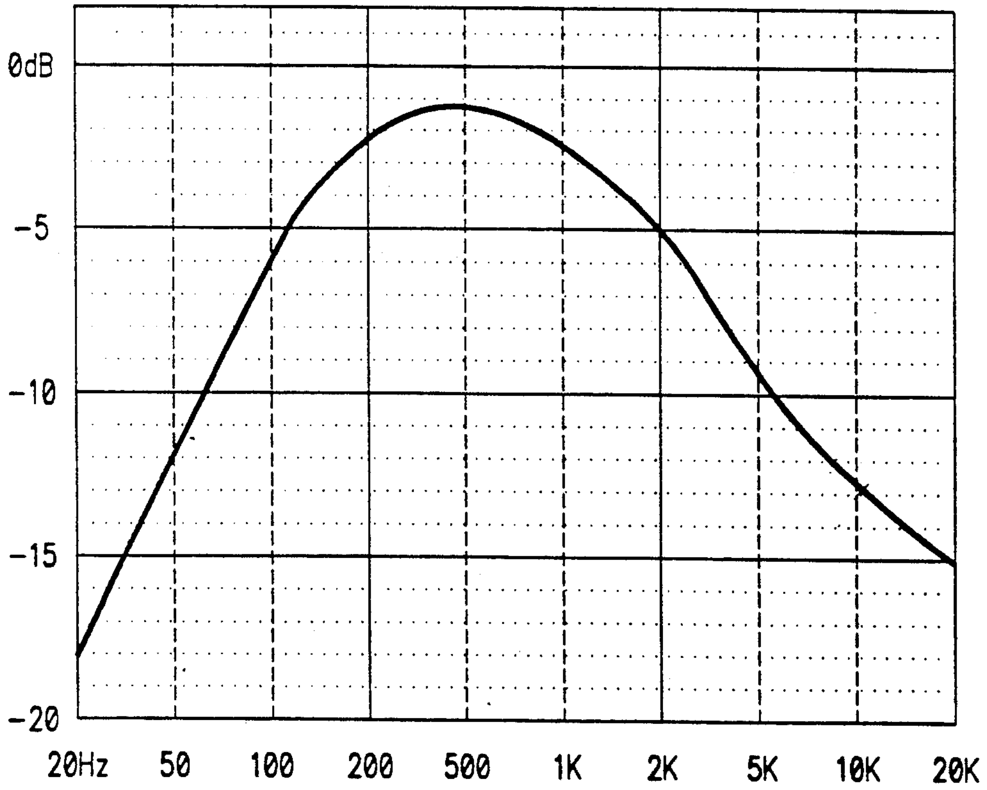
FIG. 9 is a graph showing the frequency response characteristics of the rear channel filter according to FIG. 8.

An input signal LB applied to terminal 801 will generate a modified output signal LB at terminal 802, having the frequency response characteristic shown in FIG. 9. Similarly, a second filter (not shown) of this type may be used to modify the RB signal with the same frequency response characteristic.

FIG. 9 illustrates the output amplitude in decibels plotted against frequency in Hz for the filter of FIG. 8.

Figure 10:
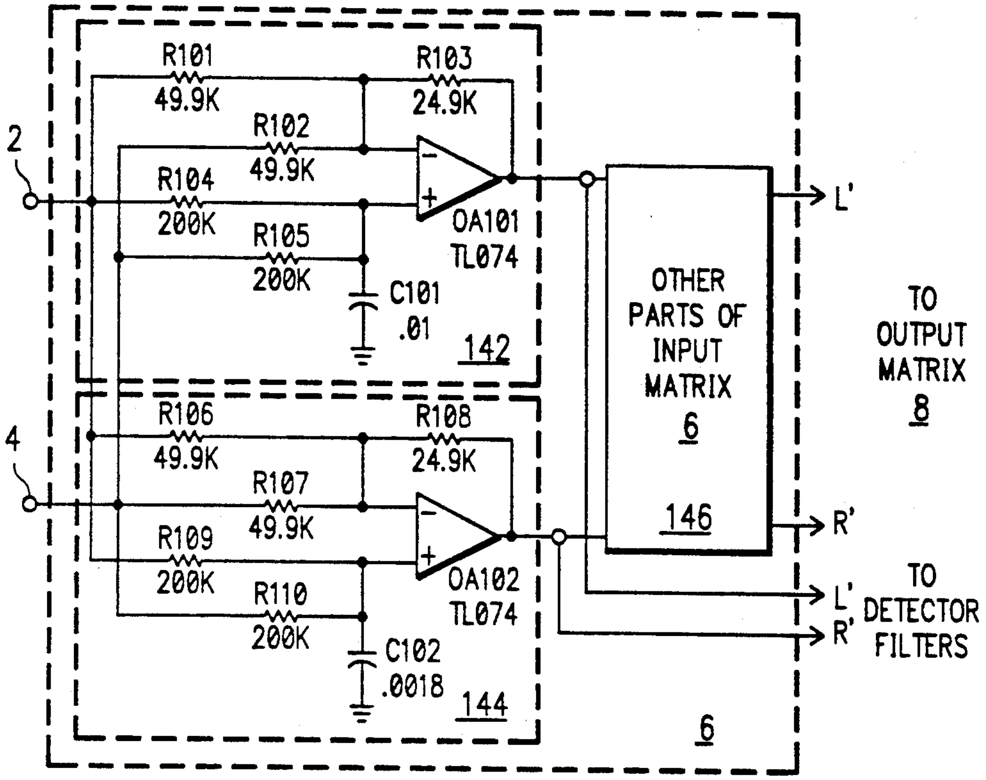
FIG. 10 is a block schematic of a dual phase shifter circuit forming part of the input conditioning matrix of the processor of FIG. 1.

FIG. 10 illustrates a dual phase shifter circuit comprising two phase shifters 142, 144, which form part of the input conditioning matrix 6 of FIG. 1. The circuit receives a monophonic input signal, which may be derived by averaging the left and right channel inputs, for example, as shown. The monophonic signal is passed through the two phase shifters 142, 144 operating at different frequencies, thereby producing a phase difference between their outputs which varies from near zero at low frequencies to a maximum at mid frequencies, returning to near zero at high frequencies. The outputs of these two phase-shifters 142, 144 become pseudo-stereo left and right channels to be applied to the remainder of the input matrixing circuitry 146 of block 6.

In FIG. 10, the left channel phase shifter 142 comprises resistors R101-R105, capacitor C101 and op-amp OA101. Resistors R101 and R102 apply equal signals from each of terminals 2 and 4 to the inverting input of op-amp OA101, while resistors R104 and R105 apply equal signals from these terminals to capacitor C101. Feedback around op-amp OA101 is provided by resistor R103.

The phase shifter circuit 144 is identical to that of the circuit 142, except that the capacitor C102 has a different value from capacitor C101. Therefore, the phase shifting effect occurs at a different frequency range, in this case over a range of frequencies about five times higher than for the phase shifter 142.

The outputs of phase shifters 142, 144 are applied to the rest of the input conditioning circuits 146 forming part of the input conditioning matrix 6. These signals, labeled L' and R', are also applied to the inputs of the detector band-pass filters 41, 42.

Figure 11:
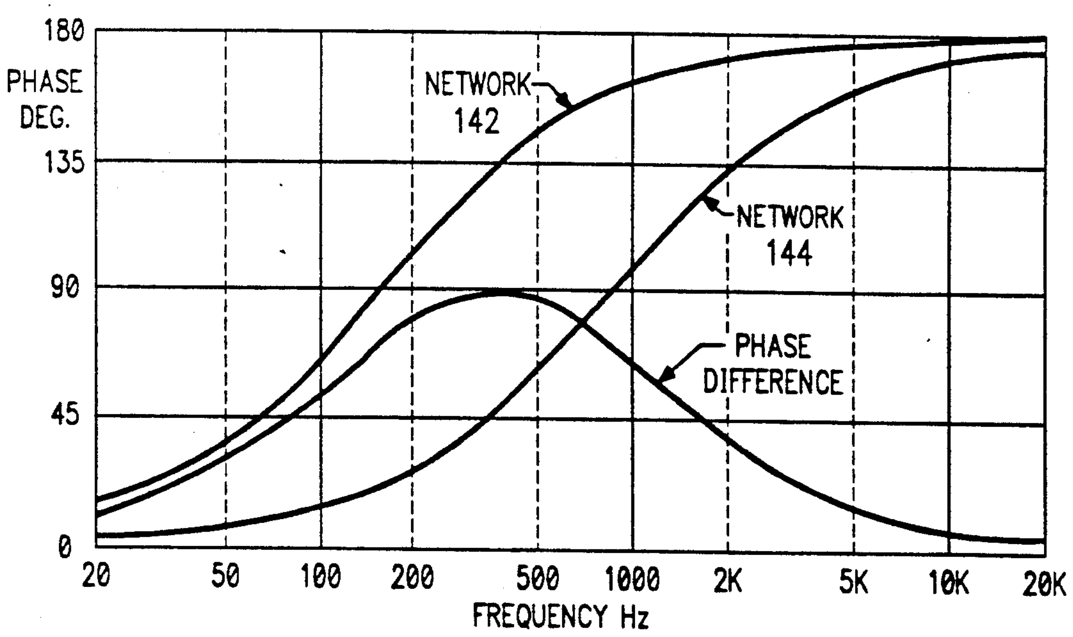
FIG. 11 is a graph showing the phase response characteristics of the phase shifters of FIG. 10 and showing the phase difference between the outputs of the shifters.

FIG. 11 shows the phase response characteristics of the two phase shifters 142, 144, and the third curve on this figure represents the phase difference between the outputs of these circuits. Phase shifter 142 has its pole at 159 Hz, while phase shifter 144 has its pole at 884 Hz. The maximum phase difference is about 88 degrees at 375 Hz.

The advantage of this pair of phase shifters over prior art methods of generating a pseudo-stereo effect, which used a single phase shifter, is that the high frequency sibilants occurring in this range above 3 kHz are brought back into phase, so that they do not "splash" into the rear channels. Further, the bass frequencies are also in phase, whereas in the prior art, either the bass or the high frequencies were out of phase, yielding unnatural bass or sibilant "splash".

These and many other modifications will become apparent to those experienced in the art, without departing from the spirit of the present invention.

What is claimed is:

1. Apparatus for rear-channel filtering of output signals derived from a surround sound processor, the apparatus comprising:

a loudspeaker array surrounding a listening area and connected to said surround sound processor for receiving said output signals, said array including front and rear loudspeakers;

a bandpass filtering circuit connected in series with each of said output signals received by said rear loudspeakers only, each said circuit providing a frequency response comprising a high frequency roll-off at 3 dB/octave above 2 kHz, and a low frequency roll-off at 6 dB/octave below 200 Hz;

such that more natural sound quality is perceived from the rear of said listening area from said rear loudspeakers when said surround sound processor directs only ambient reverberation sounds to said rear loudspeakers while direct sounds are presented on the front loudspeakers.

2. The apparatus of claim 1 wherein each said bandpass filtering circuit comprises:

an input for receiving said output signal from said surround sound processor;

an operational amplifier whose non-inverting input is grounded;

first resistor connected between said input and a first junction;

first capacitor connected between said first junction and ground;

second resistor and second capacitor connected in series between said first junction and ground;

third resistor and third capacitor, joined in series, connected between said first junction and the inverting input of said operational amplifier; and fourth resistor connected between the output and inverting input of said operational amplifier;

the output of said bandpass filtering circuit being the output of said operational amplifier.

3. The apparatus of claim 2 wherein said first resistor is designed to provide an appropriate input impedance for said bandpass filtering circuit, a suggested value being ten kilohms;

said second resistor is 0.3 times said first resistor;

said first capacitor and first resistor form a time constant of 68 ms;

said second capacitor and second resistor form a time constant of 30 ms;

said third capacitor and third resistor form a time constant of 470 ms;

said first and third resistors are equal; and said fourth resistor is designed to provide appropriate gain, and a suggested value is twice the value of said first resistor.

* * * * *